(12) United States Patent  (10) Patent No.: US 7,944,050 B2
Lim  (45) Date of Patent: May 17, 2011

(54) INTEGRATED CIRCUIT DEVICE AND A METHOD OF MAKING THE INTEGRATED CIRCUIT DEVICE

(75) Inventor: Chee Chian Lim, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 541 days.

(21) Appl. No.: 12/026,716

(22) Filed: Feb. 6, 2008

(65) Prior Publication Data

US 2009/0194873 A1   Aug. 6, 2009

(51) Int. Cl.
*H01L 23/492* (2006.01)
(52) U.S. Cl. ........ 257/738; 257/723; 257/686; 257/784; 257/700; 257/778; 257/E23.028
(58) Field of Classification Search .................. 257/738, 257/784, E23.028, 723, 778, 686, 700
See application file for complete search history.

(56) References Cited

U.S. PATENT DOCUMENTS

| 5,646,446 | A | 7/1997 | Nicewarner, Jr. et al. |
| 6,869,825 | B2 | 3/2005 | Chiu |
| 2005/0041402 | A1 | 2/2005 | Cady et al. |
| 2007/0092996 | A1* | 4/2007 | Lo et al. ......................... 438/108 |
| 2007/0252284 | A1 | 11/2007 | Su et al. |
| 2008/0157318 | A1* | 7/2008 | Chow et al. ................... 257/686 |

\* cited by examiner

*Primary Examiner* — Cuong Q Nguyen
*Assistant Examiner* — Trang Q Tran
(74) *Attorney, Agent, or Firm* — Dicke, Billig & Czaja, P.L.L.C.

(57) ABSTRACT

An integrated circuit device comprises a first semiconductor chip on a first substrate and a second semiconductor chip on a second substrate. A side surface of the first semiconductor chip is facing a side surface of the second semiconductor chip. At least one electric cable is provided to be connecting the first substrate to the second substrate.

19 Claims, 7 Drawing Sheets

INTEGRATED CIRCUIT DEVICE AND A METHOD OF MAKING THE INTEGRATED CIRCUIT DEVICE

SUMMARY

A semiconductor chip is attached onto a substrate for providing an electronic device. The electronic device provides various predetermined electronic functions.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
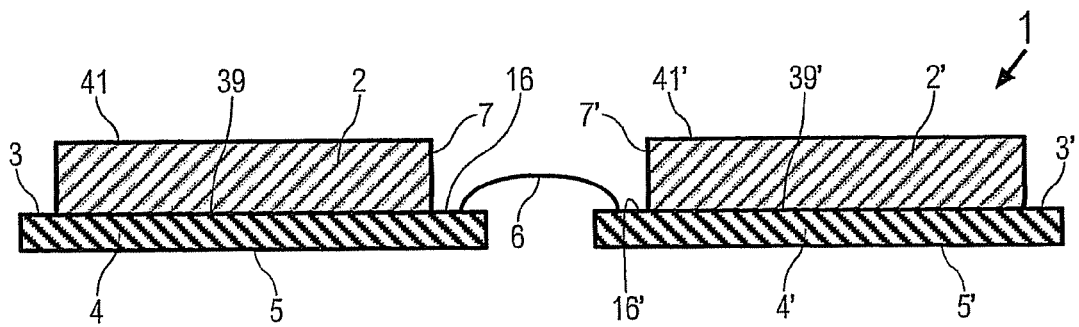
FIG. 1 illustrates a sectional view of an electronic device including two semiconductor chips.

FIG. 1 illustrates a sectional view of an electronic integrated circuit device 1 including two semiconductor chips 2, 2'. The electronic device 1 includes a first semiconductor chip 2 and a second semiconductor chip 2'. The first semiconductor chip 2 is attached to a first surface 3 of a first substrate 4. The second semiconductor chip 2' is attached to a first surface 3' of a second substrate 4'. The first semiconductor chip 2 includes an active side 39 and a passive side 41. The active side 39 is attached to the first surface. Similarly, the second semiconductor chip 2' includes an active side 39' and a passive side 41'. The active side 39' of the second semiconductor chip 2' is also attached to the second substrate 4'. First tracks 16 are provided on the first surface 3 of the first substrate 4.

Figure 2:
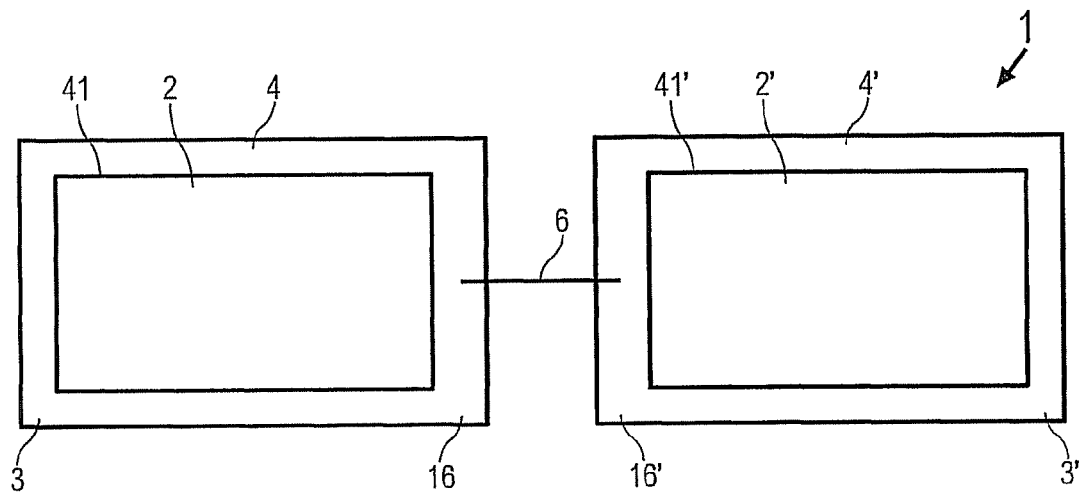
FIG. 2 illustrates a top view of the electronic device that corresponds to the FIG. 1.

As illustrated in FIG. 1, a side surface 7 of the first semiconductor chip 2 faces a side surface 7' of the second semiconductor chip 2'. There is further provided a bond wire 6 that connects to the first surface 3 of the first substrate 4 to the first surface 3' of the second substrate 4'. The bond wire 6 is better seen in FIG. 2, which is a top view of the device 1 of the FIG. 1. The first semiconductor chip 2 and the second semiconductor chip 2' are laterally distributed. A second surface 5 of the first substrate 4 and a second surface 5' of the second substrate 4' are provided at a same level of the electronic device 1.

The first semiconductor chip 2 and the second semiconductor chip 2' are laterally laid out. In particular, the active side of the first semiconductor chip 2 and the active side of the second semiconductor chip 2' are abreast of each other. The electronic device 1 is thin as compared to a stacked up arrangement of the first semiconductor chip 2 and the second semiconductor chip. The electronic device 1 is thus made thin with broad surface areas for heat dissipation. Electric connection made by the bond wire 6 can be provided by mature technologies at low cost.

In a further embodiment, the bond wire 6 can be made by gold, aluminum, copper, or any alloy of these metals. The first substrate 4 or the second substrate 4' can be any type of circuit boards that provide electrical connections for mounting a semiconductor component, which includes integrated electronic components and discrete electronic components. The first semiconductor chip 2, the second semiconductor chip 2', the first substrate 4, the second substrate 4' and the bond wire 6 can be encapsulated by a mold material that includes a material of ceramic, plastic, or epoxy.

The term semiconductor chip refers an integrated circuit that is also known as IC, microcircuit, microsemiconductor chip, silicon semiconductor chip, etc. The integrated circuit is a miniaturized electronic circuit mainly of semiconductor components, including some passive components. The bond wire 6 is a type of self-supporting electrical connecting means, which serves here as an electrical cable element.

The first semiconductor chip 2 is an integrated circuit that performs predetermined electronic functions. The first substrate 4 is a circuit board that is provided for connecting active side of the first semiconductor chip 2 to an external electronic component, such as a printed circuit board (PCB). As it is illustrated in FIG. 1, the first surface 3 of the first substrate 4 electrically connects to the active side of the first semiconductor chip 2 to the bond wire 6, whilst the second surface 5 that is opposite to the first surface 3 is provided for connecting the first semiconductor chip 2 to the external electronic component. Similarly, the second semiconductor chip 2' is also an integrated circuit that is provided for performing predetermined electronic functions. The second substrate 4' is likewise provided for electrically connecting the second semiconductor chip 2' to an external electronic component. The bond wire 6 connects the first substrate 4 to the second substrate 4' such that the first semiconductor chip 2 and the second semiconductor chip 2' can work in cooperation for carrying out predetermined electronic functions. The predetermined electronic functions include data storage and signal processing. The mold material protects the first semiconductor chip 2 and the second semiconductor chip 2' from physical damage or corrosion, which includes shocks, moisture, vibrations, and contamination. The mold material 7 also holds encapsulated interior parts of the electronic device 1 together as a solid package.

A method of producing the electronic device 1 includes providing the first substrate 4. This is followed by mounting the first semiconductor chip 2 onto the first surface 3 of the first substrate 4. The first semiconductor chip is flip-chip mounted in exemplary embodiments. The method further includes providing the second substrate 4'. The second semiconductor chip 2' is mounted onto the second substrate 4'. The second semiconductor chip 2' is also flip-chip mounted onto the second substrate 4' in certain embodiments. The first substrate is joined to the second substrate by at least one electrical cable element 6. The method provides the electronic device 1 that is thin for appliance requires compact electronic devices. For example, mobile phones, handsets of Global Positioning System, and watches have needs to thin electronic devices.

Figure 3:
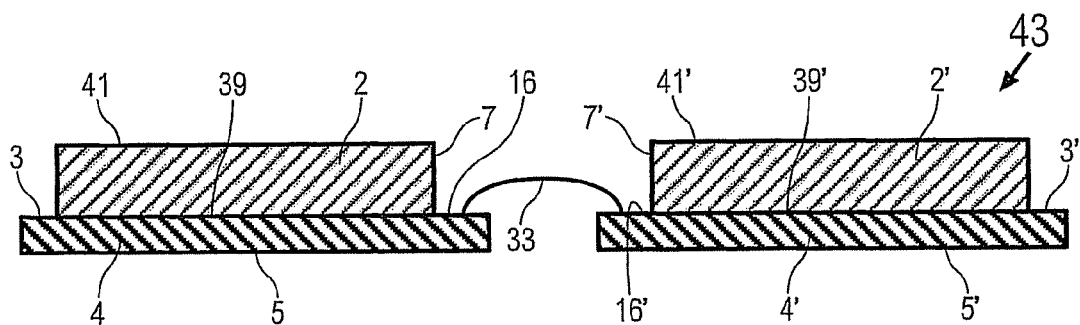
FIG. 3 illustrates a sectional view of a further electronic device with a bond tape.
Figure 4:
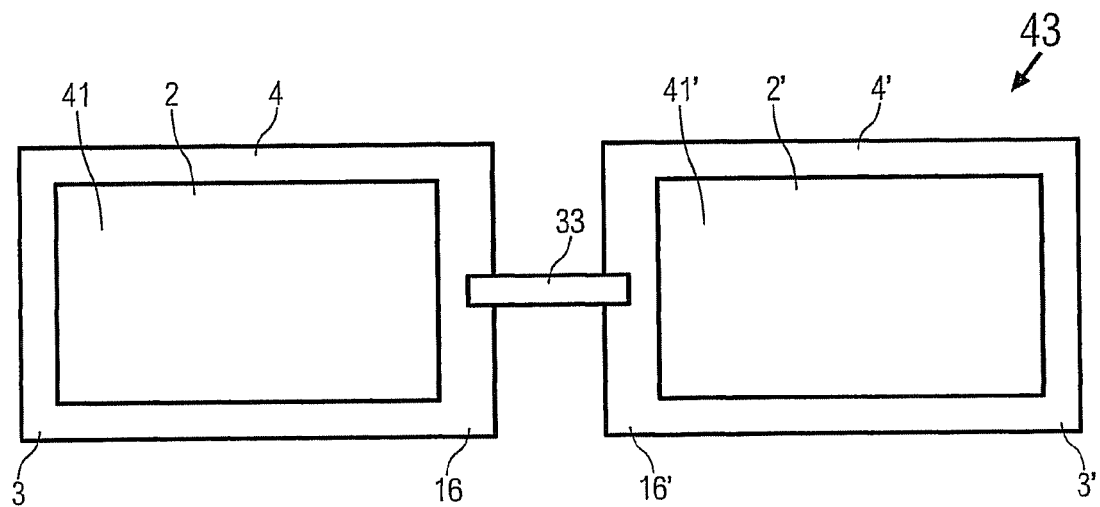
FIG. 4 illustrates a top view of the electronic device of FIG. 3.

FIG. 3 illustrates a sectional view of a further electronic device 43 with a bond tape 33. The bond tape 33 can be better seen FIG. 4, which provides a top view of the electronic device 43. The electronic device 43 includes parts that are similar to the electronic device 1 of FIGS. 1-2. The similar parts are denoted by same reference numerals and descriptions of the similar parts are hereby incorporated by reference.

The electronic device 43 includes the bond tape 33 that provides a connection between the first substrate 4 and the second substrate 4'. The bond tape 33 provides a secure and robust electrical connection between the first substrate 4 and the second substrate 4'. In a further embodiment, the bond tape 33 can be provided a metal strip that is made from gold, aluminum, copper, or a metal alloy. The bond tape 33 can be attached to the first substrate 4 and the second substrate 4' by soldering techniques. An example of the soldering technique is Tape Automated Bonding (TAB) technique.

Figure 5:
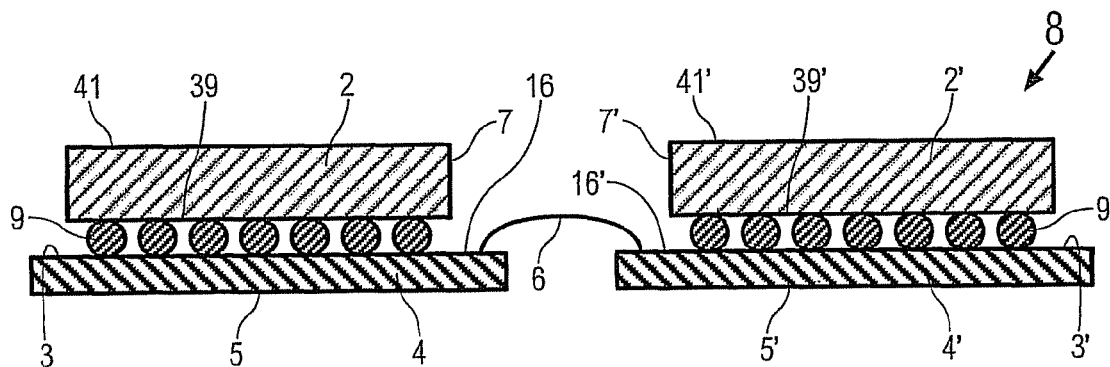
FIG. 5 illustrates a sectional view of a further electronic device with solder balls.

FIG. 5 illustrates a sectional view of a further electronic device 8 with solder balls 9, 9'. The electronic device 8 includes parts that are similar to the electronic devices 1, 43 of FIGS. 1-4. The similar parts are denoted by same reference numerals and descriptions of the similar parts are hereby incorporated by reference.

The electronic device 8 includes a first semiconductor chip 2 and a second semiconductor chip 2' that are mounted onto a first substrate 4 and a second substrate 4' respectively. The first substrate 4 is linked to the second substrate 4' by a bond wire 6. There is provided an array of solder balls 9 between an active side of the first semiconductor chip 2 and the first substrate 4.

The array of solder balls 9 is provided between the active side of the first semiconductor chip 2 and the first surface of the first substrate 4. Similarly, another array of solder balls 9' is also provided between the active side of the second semiconductor chip 9' and the second substrate 4'. The arrays of solder balls 9, 9' are examples of connecting elements 9, 9' for flip-chip mounting the first semiconductor chip 2 and the second semiconductor chip 2'.

A suitable flip-semiconductor chip mounting technique is known as Controlled Collapse Semiconductor chip Connection, or C4. The boom in flip semiconductor chip packaging results both from the electronic device's 8 advantages in size, performance, flexibility, reliability, and cost over other packaging methods and from the widening availability of flip semiconductor chip materials, equipment, and services.

For example, flip semiconductor chip mounting technique eliminates reduce required board area for bond wires by up to about 95%, and requires less height. Weight can be less than about 5% of packaged device weight. The flip semiconductor chip technique can produce the simple and small electronic devices, which are smaller than Semiconductor chip Scale Packages (CSP's).

Flip-chip mounted electronic devices offer the high-speed electrical performance of any assembly method. Eliminating bond wires reduces the delaying inductance and capacitance of the connection by a factor of about 10, and shortens the path by a factor of about 25 to 100. The result is high speed of semiconductor chip interconnection. The flip semiconductor chip mounting technique also provides input/output connection flexibility because flip semiconductor chip connections uses majority area of the semiconductor chip, accommodating many more connections on a small semiconductor chip. Area connections also allow 3-D stacking of semiconductor chip and other components. The flip semiconductor chip technique provides low cost interconnection for high volume automated production.

The electronic device 8 is made more compact than a carrier-based electronic device for mounting the first semiconductor chip 2 and the second semiconductor chip 2'. Since the first semiconductor chip 2 and the second semiconductor chip 2' are provided directly on the first substrates 4 and the second substrate 4', the electronic device 8 includes smaller substrates than the carrier-based electronic device both in area and height. The electronic device 8 with the flip-semiconductor chip mounted semiconductor chips 2, 2' are suitable for cell phones, pagers and other small electronics where the size savings are valuable.

A number of alternatives to the solder balls can be introduced in other possible embodiments, including gold balls or molded studs, electrically conductive plastics, and the "plated bump" process that removes an insulating plating by chemical means.

The solder balls 9 are provided for electrically connecting the active side of the first semiconductor chip 2 to the first substrate 4. The solder balls 9' between the second semiconductor chip 2' and the second substrate 4' also electrically connect the active side of the second semiconductor chip 2' to the second substrate 4'. The solders balls 9, 9' are provided for flip-chip mounting the first semiconductor chip 2 and the second semiconductor chip 2' to the first substrate 4 and to the second substrate 4' respectively. The electronic device 8 of FIG. 5 requires an additional process of providing the array of solder balls 9 between the active side of the first semiconductor chip 2 and the first surface 3 of the first substrate 4. Similarly, the array of solder balls 9' is also provided between the active side of the second semiconductor chip 2' and the first surface 3' of the second substrate 4'.

Figure 6:
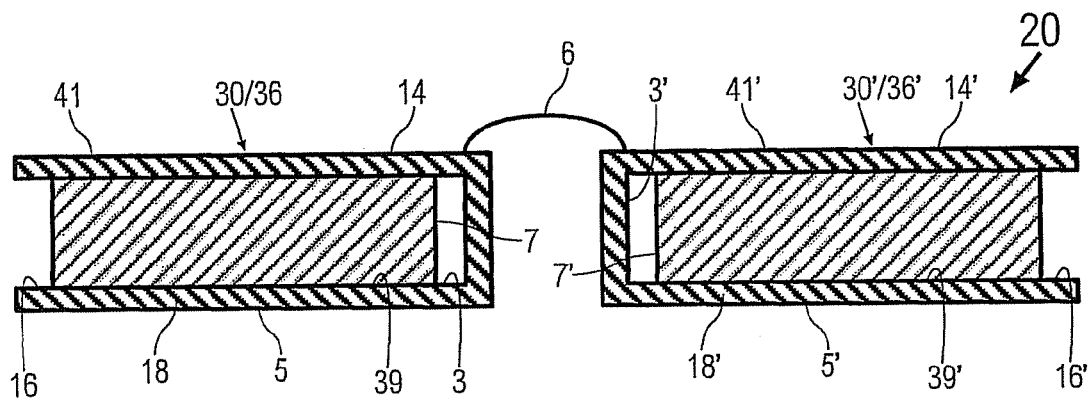
FIG. 6 illustrates a sectional view of a further electronic device with flexible circuit boards.

FIG. 6 illustrates a sectional view of a further electronic device 20 with flexible circuit boards 18, 18'. The electronic device 20 includes parts that are similar to the electronic devices 1, 8, 43 of FIGS. 1-5. The similar parts are denoted by same reference numerals and descriptions of the similar parts are hereby incorporated by reference.

The electronic device 20 of FIG. 6 includes a first flexible assembly 30 and a second flexible assembly 30'. The first flexible assembly 36 and the second flexible assembly 36' are laterally distributed. A bond wire 6 is provided that is joining the first flexible assembly 36 to the second flexible assembly 36'.

The first flexible assembly 36 includes a first flexible circuit board 18 and a first semiconductor chip 2. The first flexible circuit board 18 is folded at a middle position with two parallel braches that define an opening. The first semiconductor chip 2 is enclosed by and attached to a first surface 3 of the first flexible circuit board 18. A second surface 5 of the first flexible circuit board 18 is an external surface of the first flexible assembly 36.

Similarly, the second flexible assembly 36' includes a second flexible circuit board 18' and the second semiconductor chip 2'. The second flexible circuit board 18' includes similar profiles as the first flexible circuit board 18, whilst an opening of the second flexible circuit board 18' faces an opposite side of the opening of the first flexible substrate 18. A first surface 3' of the second flexible circuit board 18' is provided to enclose the second semiconductor chip 2'. The second semiconductor chip 2' is attached onto a first surface 3' of a second flexible circuit board 18'. A second surface 5' of the second flexible circuit board 18' is provided at an opposite side of the second flexible circuit board 18'.

The electronic device 20 of FIG. 6 provides a thin semiconductor package that has extended surface area fir heat dissipation. Furthermore, in contrast to a rigid printed circuit board, the first flexible circuit board 18 provides shape flexibility for space savings to the electronic device 20. In a further embodiment, more semiconductor chips can be attached to the first flexible circuit board 18 when more folds are introduced to the first flexible circuit board 18 for packaging multiple semiconductor chips inside the folds. The flexible circuit board 18 with many folds does not enlarge a footprint of the first flexible assembly 36 for packaging the multiple semiconductor chips since the multiple semiconductor chips can be attached to each of the folds respectively. Weight reduction can be also achieved for packaging the multiple semiconductor chips by the avoidance of multiple rigid substrates.

The first flexible circuit board 18 and the second flexible circuit board 18' are both flexible substrates. A flexible substrate is disclosed in U.S. Pat. No. 5,646,446 to Nicewarner, Jr. and Frinak which is incorporated by reference herein. Similar functions and advantages are provided by the first flexible circuit board 18 and the second flexible circuit board 18'. The electronic device 20 of FIG. 6 is provided by providing flexible circuit boards 18, 18', in addition to processes that are similar to the processes of making the electronic devices of FIGS. 1-2.

Figure 7:
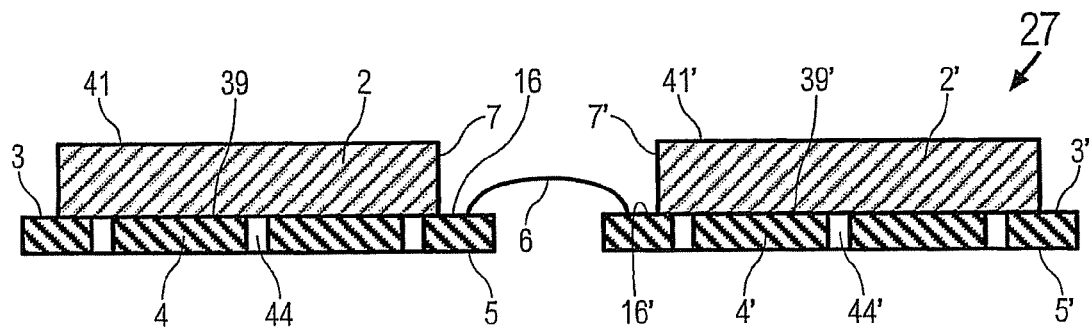
FIG. 7 illustrates a sectional view of an electronic device with electrical vias.

FIG. 7 illustrates a sectional view of an electronic device 27 with electrical vias 44, 44'. The electronic device 27 includes parts that are similar to the parts of previously described electronic devices 1, 8, 20. The similar parts are denoted by same reference numerals. Descriptions of the similar parts are hereby incorporated by reference.

The electronic device 27 includes a first semiconductor chip 2 and a second semiconductor chip 2'. An active side of the first semiconductor chip 2 is attached to a first surface 3 of the first substrate 4. An active side of the second semiconductor chip 2' is attached to a first surface 3' of the second substrate 4'. A bond wire 6 is provided for joining the first substrate 4 to the second substrate 4'. A side surface of the first semiconductor chip 2 is facing a side surface of the second semiconductor chip 2'.

The first substrate 4 includes a plurality of through substrate channels that are in the form of electrical vias 44. The electrical vias 44 connects the first surface of the first substrate 4 to a second surface 5 of the first substrate 4. In a similar manner, the second substrate 4' includes a plurality of through substrate channels that are in the form of electrical vias 44'. The electrical vias 44' connects the first surface of the second substrate 4' to a second surface 5' of the first substrate 4'.

The electrical vias 44 provide short paths of electrical connections between the first surface 3 of the first substrate 4 and the second surface 5 of the first substrate 4. The electrical vias 44 does not extend outside the first substrate 4 so that a footprint 3 or the first surface 3 of the first substrate 4 is reduced. Furthermore, the first semiconductor chip 2 and the second semiconductor chip 2' are provided to be abreast with respect to each other so that the electronic device 27 is made thin. The electronic device 27 also provides large areas for heat dissipation. The electrical vias 44' of the second substrate 4' provides similar advantages as the electrical vias 44 of the first substrate 4. The electric vias 44, 444' is provided to reduce weight of the electronic device 11, as compared to a bond wire connected electronic device.

The electrical vias 44, 44' are through substrate electrical conductive channels, which can be provided by solid or hollow cylinders in other embodiments. Various electrical conductive materials can be used for making electrical vias 44, 44', which includes copper, carbon, aluminum, silver, gold, or other metals. The electrical vias 44 provides short electrical connections between at least one track on the first surface of the first substrate 3 and at least one track on the second surface 5 of the first substrate 4. In a further embodiment, the electrical vias 44 can be electrically connected to the active side of the first semiconductor chip 2 through other electrical conducting means, such as solder balls or metal pins.

The electronic device 27 of FIG. 7 is provided by additional processes of providing electrical vias 44, 44' to the first substrate 4 and the second substrate 4' respectively. Other processes of making the electronic device 27 are similar to that of making the electronic device 1 of FIG. 1.

Figure 8:
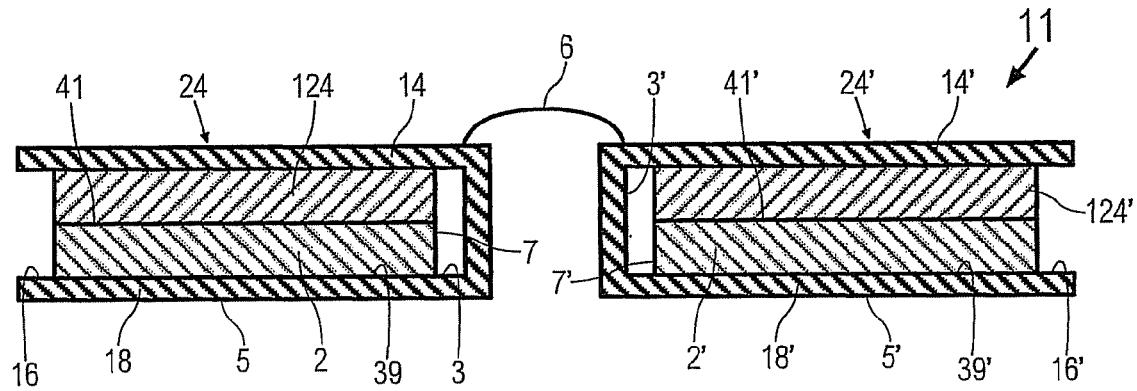
FIG. 8 illustrates a sectional view of a further electronic device.

FIG. 8 illustrates a sectional view of a further electronic device 11. The electronic device 11 includes parts that are similar to the parts of previously described electronic devices 1, 8, 20, 27. The similar parts are denoted by same reference numerals. Descriptions of the similar parts are hereby incorporated by reference.

The electronic device 11 of FIG. 8 includes a first flexible assembly 24 and a second flexible assembly 24'. The first flexible assembly 24 is placed laterally next to the second flexible assembly 24'. As it illustrated in FIG. 8, the first flexible assembly 24 and the second flexible assembly 24' are in an abreast configuration. A second surface 5 of the first flexible assembly 24 is provided at a same level of a second surface 5' of the second flexible assembly 24'. A bond wire 6 is provided between the first flexible assembly 24 and the second flexible assembly 24'. The bond wire 6 connects a second surface 5 on a first flexible circuit board 18 of the first flexible assembly 24 to a second surface 5' of a second flexible circuit board 18' of the second flexible assembly 24'.

The first flexible assembly 24 includes a first semiconductor chip 2, a third semiconductor chip 124 and a first flexible circuit board 18. Both the first semiconductor chip 2 and the third semiconductor chip 124 are attached to a first surface 3 of the first flexible circuit board 18. A passive side of the first semiconductor chip 2 and a passive side of the third semiconductor chip 124 are facing each other. The first flexible circuit board 18 is bent to form a fold such that both the first semiconductor chip 2 and the third semiconductor chip 124 are enclosed by the first flexible circuit board 18. The second flexible assembly 24' includes a second semiconductor chip 2', a fifth semiconductor chip 124', and a second flexible circuit board 18'. The second flexible assembly 24' has similar construction as the first flexible assembly 24.

The electronic device 11 of FIG. 8 provides a thin semiconductor package because the two flexible assemblies 24, 24' are abreast to each other. Heat dissipation areas of the semiconductor device 11 is large by including both the first surface 5 of the first flexible circuit board 18 and the first surface 5' of the second flexible circuit board 18'. The electronic device 11 is also compact because the first flexible assembly 24 and the second flexible assembly 24' each include two semiconductor chips. More electronic functions and better performances are provided by the electronic device 11. Furthermore, the first semiconductor chip 2 and the third semiconductor chip 124 communicate to each other via tracks on the first flexible circuit board 18. The fifth semiconductor chip 124' and the second semiconductor chip 2' provides similar electronic functions and performance, as compared to the first semiconductor chip 2 and the third semiconductor chip 124.

A method of making the electronic device 11 includes mounting the third semiconductor chip 24 onto the first surface 3 of the first flexible circuit board 18. Other processes of making the electronic device 11, which are similar to the processes of making the electronic device 20 of FIG. 6 are hereby incorporated by reference.

Figure 9:
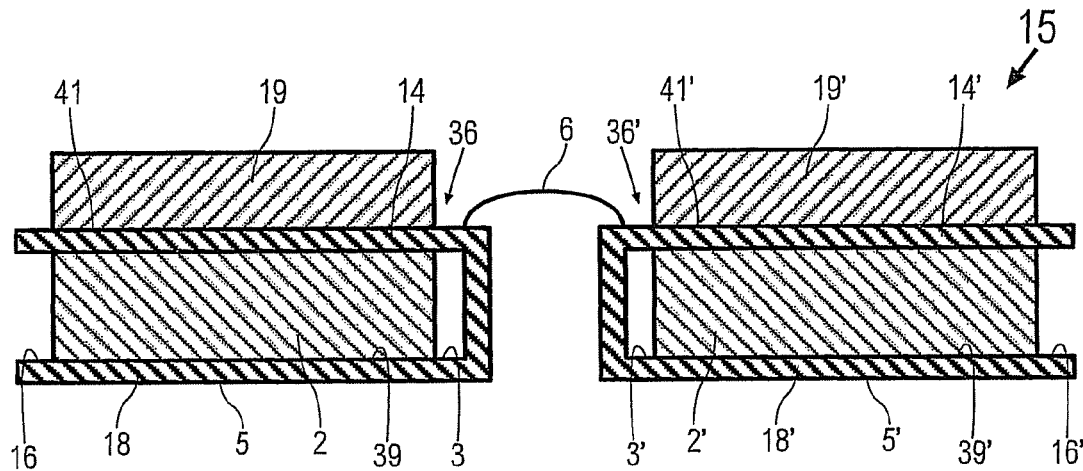
FIG. 9 illustrates a sectional view of a further electronic device.

FIG. 9 illustrates a sectional view of a further electronic device 15. The electronic device 15 includes parts that are similar to the parts of previously described electronic devices 1, 8, 20, 27, 11. The similar parts are denoted by same reference numerals. Descriptions of the similar parts are hereby incorporated by reference.

The electronic device 15 includes a first flexible assembly 30, a second flexible assembly 30', whilst the first flexible assembly 30 is connected to the second flexible assembly 30' by a bond wire 6. The first flexible assembly 30 and the second flexible assembly 30' are provided to be abreast to each other. As it is illustrated in FIG. 6, the first flexible assembly 30 is laterally adjacent to the second flexible assembly 30'.

The first flexible assembly 30 includes a first semiconductor chip 2, a fourth semiconductor chip 19 and a first flexible circuit board 18. The first flexible circuit board 18 is folded such that a first surface 3 of the first flexible circuit board encloses the first semiconductor chip 2. The folded first flexible circuit board includes an upper branch and a lower branch. There is also provided a fourth semiconductor chip 19, which is attached to a second surface 5 of the first flexible circuit board 18. The first semiconductor chip 2, the upper branch, and the fourth semiconductor chip 19 are stacked up sequentially.

The second flexible assembly 30' includes a third semiconductor chip 2', a second flexible circuit board 18' and a sixth semiconductor chip 19'. The second flexible assembly 30' includes parts and structures that similar to the first flexible assembly 30'. The descriptions of the first flexible assembly 124 are hereby incorporated by reference.

The electronic device 15 of FIG. 9 provides a semiconductor package with multiple semiconductor chips without introducing multiple folds in a single flexible circuit board. The electronic device 15 of FIG. 9 is compact with extended electronic functionalities. The first flexible assembly 30 and the second flexible assembly 30' include two semiconductor chips respectively. For example, the two semiconductor chips 2, 19 of the first flexible assembly 30 communicate to each other through tracks on the first surface 3, electrical vias and tracks on the second surface 5. The first flexible assembly 30 is thus made compact with the multiple semiconductor chips 2, 19. Complex or advanced electronic functions are provided by the first semiconductor chip 2, the second semiconductor chip 2' the fourth semiconductor chip 19, and the sixth semiconductor chip 19' that communicate to each other. The semiconductor device 15 of FIG. 9 also provides large areas for heat dissipation when the semiconductor device 15 is in operation.

A method of making the semiconductor device 15 includes mounting the fourth semiconductor chip 19 onto the second surface 5 of the first flexible circuit board 18. The method of making the semiconductor device 15 also includes mounting the sixth semiconductor chip 19' onto the second surface 5' of the second flexible circuit board 18'. The method of making the semiconductor device 15 further includes processes that are similar to the processes for making the semiconductor device 20 of FIG. 6. The descriptions of the similar processes are hereby incorporated by reference.

Figure 10:
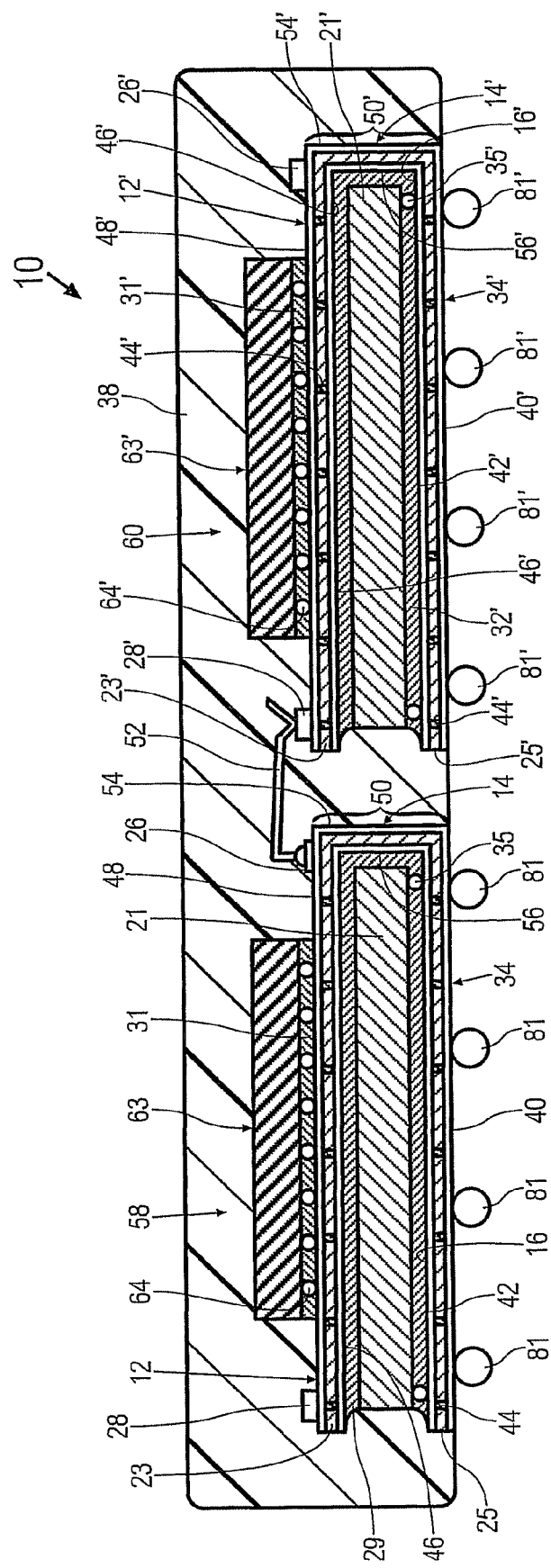
FIG. 10 illustrates a sectional view of an electronic device including top semiconductor chips.

FIG. 10 illustrates a sectional view of a further electronic device 10.

The electronic device 10 includes a first flexible assembly 58 and a second flexible assembly 60, which is arranged laterally next to the first flexible assembly 58. A bond wire 52 is joined between the first flexible assembly 58 and the second flexible assembly 60. The first flexible assembly 58, the second flexible assembly 60, and the bond wire 52 are enveloped by a mold material 38.

The first flexible assembly 58 includes a first mother semiconductor chip 34 and a top semiconductor chip 63, the top semiconductor chip 63 being placed on top of the first mother semiconductor chip 34.

The first mother semiconductor chip 34 includes a first flexible circuit board 12 that is provided in a folded form of U-profile with an upper branch 23 and a lower branch 25 being joined by a bend portion 50. The upper branch 23 and the lower branch 25 enclose a semiconductor chip 21 such that a top surface 42 of the lower branch 25 is facing an active side of the semiconductor chip 21.

An adhesive material 29 is provided between the semiconductor chip 21 and a bottom surface 46 of the upper branch 23.

The first flexible circuit board 12 includes electrically conductive outer tracks 14 and inner tracks 16. The inner tracks 16 are also known as first tracks 16, whilst the outer tracks 14 are also known as second tracks 14. The outer tracks 14 are provided on a top surface 48 of the upper branch 23, on an outer surface 54 of the bend portion 50, and on a bottom surface 40 of the lower branch 25. The inner tracks 16 are provided on the bottom surface 46 of the upper branch 23, on an inner surface 56 of the bend portion 50, and on the top surface 42 of the lower branch 25. Both the outer tracks 14 and the inner tracks 16 are made of copper alloy. The inner tracks 16 and the outer tracks 14 are formed according to a predetermined pattern. The outer tracks 14 and the inner tracks 16 are separated by an electrically insulating plastic layer 42 which is of uniform thickness and which includes a plurality of electrical vias 44. The plastic layer 42 is pliable and is made up of polyimide. The electrical vias 44 are through-substrate electrical conductive channel and they 44 connect predetermined parts of the inner tracks 16 to predetermined parts of the outer tracks 14.

Solder balls 35 are provided between the semiconductor chip 21 and the top surface 42 of the lower branch 25. The solder balls 35 electrically connect the active side of the semiconductor chip 21 to the inner tracks 16. An underfill material 32 is provided between the top surface 42 and the semiconductor chip 21, thereby filling the void between the solder balls 35.

The top semiconductor chip 63 is connected to the outer tracks 14 of the upper branch 23 by solder balls 64. Void between an active side of the top semiconductor chip 63 and the top surface 48 of the upper branch 23 is filled by the underfill material 31.

The bottom surface 40 of the lower branch 25 is provided with solder balls 81 that are connected to the outer tracks 14 of the lower branch 25. The solder balls 81 provide external electrical connections for the first flexible assembly 58.

A first contact pad 26 and a second contact pad 28 are provided on top surface of the outer tracks 14. The first contact pad 26 and the second contact pad 28 are located on opposite ends of the upper branch 23.

The second flexible assembly 60 is similar to the first flexible assembly 58. The same reference numerals with a prime symbol are used for parts with a similar shape or function.

The first contact pad 26 is electrically connected to a first end of the bond wire 52 by a ball bond. In a similar manner, the second contact pad 28' is electrically attached to a second end of the bond wire 52 by a wedge bond. The bond wire 52 is a self-supporting type which is electrical conductor in the form a metal devoid of foreign structure for holding itself. Unlike copper alloy tracks on a Power Circuit Board, the bond wire 52 retains and support its own weight without external help. The bond wire 52 is produced from a gold wire with a diameter of about 50 μm and has the shape of a gradual arc.

The embodiment of FIG. 10 provides multiple flexible assemblies of semiconductor chips to be placed laterally to form a single electronic device. The electronic device 10 is more compact as compare to four laterally separated semiconductor chips or four individually packaged semiconductor chips. Electrical connections between the semiconductor chips of the electronic device 10 are easily provided by the bond wire 52 and the flexible circuit boards 12, 12'.

The electronic device 10 made by flip semiconductor chip technique includes mechanically rugged electrical interconnections. The electronic device 10, when completed with the underfill material 32 is a solid block of cured mold material. The electronic device can survive laboratory equivalents of rocket liftoff and of artillery firing, as well as millions of cumulative total hours of actual use in computers and under automobile hoods.

In a further embodiment, since the first flexible assembly 58 is provided with two contact pads 26, 28 that are positioned at opposite ends of the upper branch 23, the first flexible assembly 58 can be moved laterally to the other side of the second flexible assembly 60, thereby connecting the contact pads 26' and 28 together. This arrangement provides interchangeability of different flexible assemblies. In other words, flexible assemblies of the same type or made from the same batch can be selected for making the electronic device 10.

In a further embodiment, more than one bond wire, more than one first contact pad and more than one second contact pad can be included. The semiconductor chip 21 can be of a different type of semiconductor chip 21'. For example, the semiconductor chip 21 can be a logic semiconductor chip, whilst the semiconductor chip 21' can be an analogue semiconductor chip or a power semiconductor chip. The encapsulating compound 38, which is also known as mold material, can include ceramic, plastic, or other insulating polymer mold materials, such as an epoxy-mold material. The bond wire 52 may also be replaced by a metal strip, such as an aluminum strip or copper alloy strip. The bend portion 50 can be made broader or more detached from the enclosed semiconductor chip 21 with some additional supporting structure or a stronger layer between the inner tracks 16 and the outer tracks 14.

The active side of the top semiconductor chip 63 is connected to the solder balls 81 by electrical paths that are provided by the solder balls 64 and the outer tracks 14.

The solder balls 81 are also connected to the active side of the semiconductor chip 21 by electrical paths provided by the inner tracks 16, the electrical vias 44, and the outer tracks 14.

Likewise, the solder balls 64, the outer tracks 14, the electrical vias 44, and the solder balls 35 provide electrical paths between the active side of the top semiconductor chip 63 and the active side of the semiconductor chip 21.

Electrical signals from the active side of the top semiconductor chip 63 reach the solder balls 81' by electrical paths that are provided by the solder balls 64, the outer tracks 14, the first contact pad 26, the bond wire 52, the second contact pad 28', and the outer tracks 14'.

Similarly, electrical paths between the active side of the top semiconductor chip 63 and the active side of the top semiconductor chip 63' are determined by the solder balls 64, the outer tracks 14, the first contact pad 26, the bond wire 52, the second contact pad 28', and the solder balls 64'.

The active side of the top semiconductor chip 63 is connected to the semiconductor chip 21' by electrical paths that are arranged by the solder balls 64, the outer tracks 14, the first contact pad 26, the bond wire 52, the second contact pad 28', the outer tracks 14', the electrical vias 44', the inner tracks 16', and the solder balls 35'.

Electrical connections between the active side of the semiconductor chip 21 and the solder balls 81' are made by the solder balls 35, the electrical vias 44, the outer tracks 14, the first contact pad 26, the bond wire 52, the second contact pad 28', and the outer tracks 14'.

The active side of the semiconductor chip 21 is connected to the top semiconductor chip 63' by electrical channels that are provided by the solder balls 35, the electrical vias 44, the outer tracks 14, the first contact pad 26, the bond wire 52, the second contact pad 28', the outer tracks 14', and the solder balls 64'.

Electrical signals of the semiconductor chip 21 reach the semiconductor chip 21' through electrical paths that are provided by the solder balls 35, the electrical vias 44, the first contact pad 26, the bond wire 52, the second contact pad 28', the outer tracks 14', the electrical vias 44', and the solder balls 35'.

The top semiconductor chip 63' is connected to solder balls 81 by electrical paths that are provided by the solder balls 64', the outer tracks 14', the second contact pad 28', the bond wire 52, the first contact 26, and the outer tracks 14.

The solder balls 35', the electrical vias 44', the outer tracks 14', the second contact pad 64', the bond wire 52, the first contact pads 26, and the outer tracks 14 similarly provide electrical paths between the active side of the semiconductor chip 21' and the solder balls 81.

The first flexible assembly 58 provides electronic functions that cooperate with the functions of the second flexible assembly 60. The solder balls 81 and the solder balls 81' provide the first flexible assembly 58 and the second flexible assembly 60 with electrical connections to an external substrate, such as a printed circuit board or an electronic device.

The underfill materials 31, 31', 32, 32', the adhesive material 29, 29' together with the mold material 38 form an interlocking structure which holds parts of the electronic device 10 together in a robust form. The underfill materials 31, 31', 32 and 32' also provide electrical insulation, heat conduction, and mechanical bonding between parts contiguous to the underfill material 31, 31', 32, or 32'. They also relieve mechanical stress experienced by the solder balls 35', 35', 64, 64' due to differential heating between the semiconductor chips 21 or 21' and the rest of the electronic device 10. The mold material 38 is used for protecting the top semiconductor chips 63, 63' and the semiconductor chips 21, 21' from the external environment. These flexible assemblies 58, 60 are of the same type, produced in a single batch, passed through electrical testing, and used for an electronic device.

Figure 11:
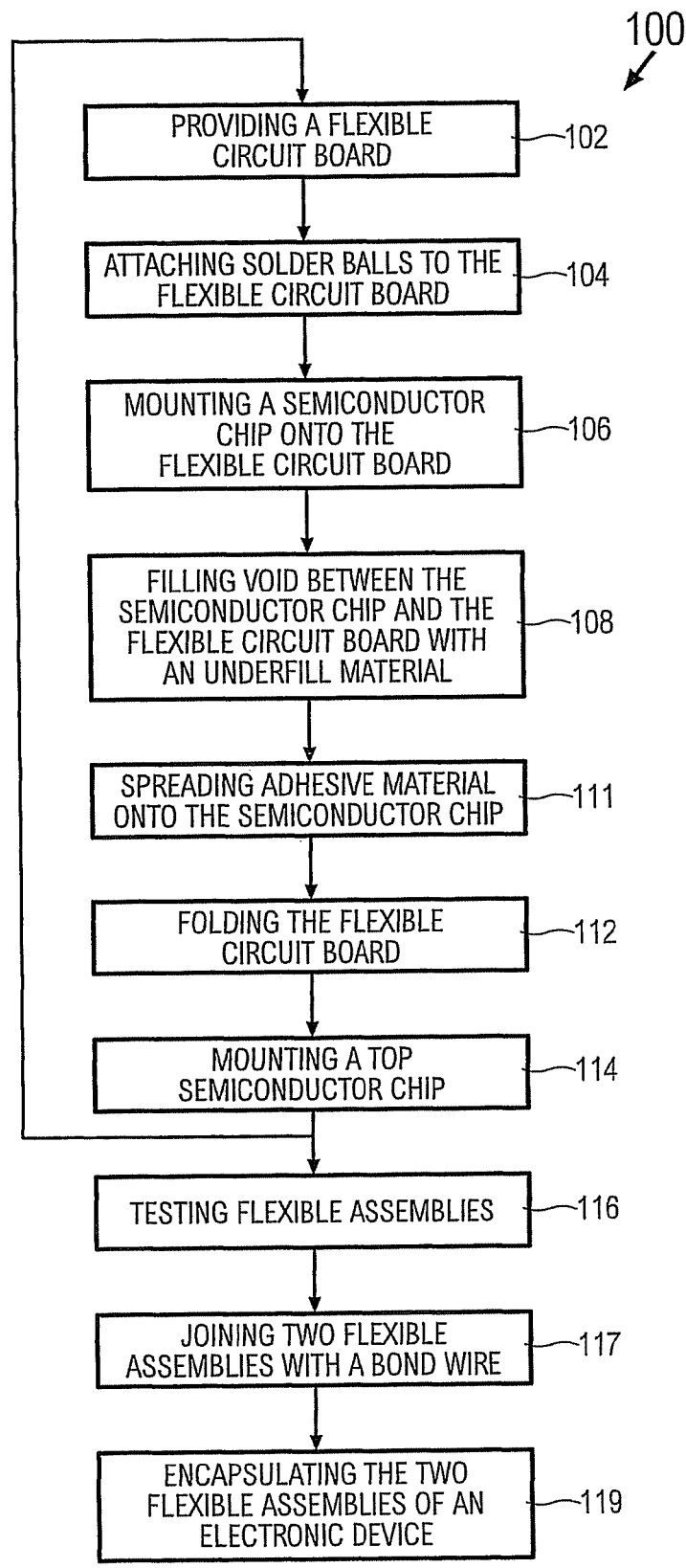
FIG. 11 illustrates a method of making the electronic device of FIG. 10.

FIG. 11 illustrates a method 100 of making the electronic device 10 of FIG. 10. The method 100 includes a process 102 in which a flexible circuit board is provided. The solder balls 81, 64 are then attached to the outer tracks 14 of the flexible circuit board and the solder balls 35 are attached to the inner tracks 16 of the flexible circuit board, as illustrated in block 104. The semiconductor chip 21 is later mounted onto the solder balls 35, which is illustrated in block 106. As illustrated in block 108, the underfill material 32 is then provided at the periphery of the semiconductor chip 21 and is sucked into the void between the active side of the semiconductor chip 21 and the first flexible circuit board 12 by capillary action.

In a following process 111, the adhesive material 29 is evenly spread over a surface of the semiconductor chip 21, the surface being opposite to the active side of the semiconductor chip 21. Later in block 112, the first flexible circuit board 12 is folded into a U-profile such that the upper branch 23 of the first flexible circuit board 12 is in contact with the adhesive material 29 and the first flexible circuit board 12 encloses the semiconductor chip 21. The top semiconductor chip 63 is then mounted onto the solder balls 64, in block 114. The underfill material 32 is also provided at the periphery of the top semiconductor chip 63 and is later sucked into the void between the top semiconductor chip 63 and the first flexible circuit board 12 by capillary action.

The second flexible assembly 60 is later produced by processes 102 to 114. The first flexible assembly 58 and the second flexible assembly 60 are later tested individually before encapsulation, as illustrated in block 116. Any flexible assembly that is found to be defective by the test is replaced by a tested-good flexible assembly.

In block 117, the first flexible assembly 58 and the second flexible assembly 60 are afterwards laid laterally on a platform such that the solder balls 81 and the solder balls 81' are on a same side of the platform. In block 117, the bond wire 52 is later bonded onto the first contact pad 26 of the first flexible assembly 58 and onto the second contact pad 28' of the second flexible assembly 60. The bonding is carried out using pressure, heat, and ultrasonic techniques. The bonding thereby electrically connects the first flexible assembly 58 to the second flexible assembly 60. In a following process 119, the first flexible assembly 58, the bond wire 52, and the second flexible assembly 60 are encapsulated by the mold material 38 whilst the solder balls 81, 81' are not covered by the mold material 38.

The method 100 of making the electronic device 10 can be carried out using existing equipment for typical semiconductor packaging without investment in special tools. Desired functionalities of the electronic device 10 can be attained before the encapsulating process 119, which is at a very late time of assembly. The flexible circuit boards can be provided by separating a flexible strip into multiple flexible circuit boards for improving efficiency and reducing process cost.

The first flexible assembly 58 can also work independently from the second flexible assembly 60. The first flexible assembly 58 can, if needed, alternate between a mode of working together with the second flexible assembly 60 and another mode of working independently from the second flexible assembly 60 during different time periods.

Figure 12:
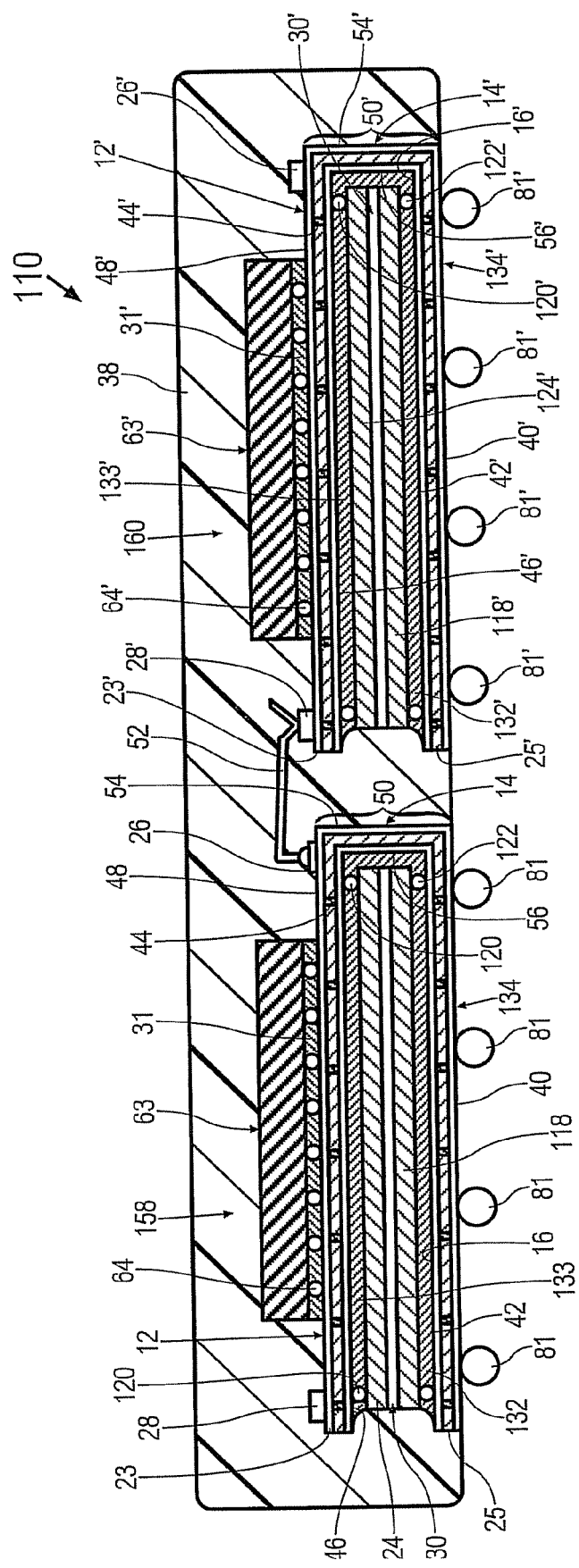
FIG. 12 illustrates a sectional view of a further electronic device.

FIG. 12 illustrates a sectional view of a further electronic device 110. The electronic device 110 includes parts that are similar to the parts of the embodiment of FIGS. 1-9. The similar parts are denoted with the same reference numerals. The descriptions of the similar parts of other previously described embodiments are therefore incorporated by reference.

The electronic device 110 includes a first flexible assembly 158 and a second flexible assembly 160 that is joined to the first flexible assembly 158 by the bond wire 52. The second flexible assembly 160 is arranged laterally next to the first flexible assembly 158. The first flexible assembly 158, the second flexible assembly 160, and the bond wire 52 are wrapped by the mold material 38.

The first flexible assembly 158 includes a first mother semiconductor chip 134 and the top semiconductor chip 63, the top semiconductor chip 63 being placed on top of the first mother semiconductor chip 134.

The first flexible circuit board 12 of the first mother semiconductor chip 134 encloses an upper semiconductor chip 124 and a lower semiconductor chip 118. The bottom surface 46 of the upper branch 23 is facing an active side of the upper semiconductor chip 124 and a top surface 42 of the lower branch 25 is facing an active side of the lower semiconductor chip 118. The adhesive material 29 is provided between the upper semiconductor chip 124 and the lower semiconductor chip 118.

Solder balls 120 are provided between the upper semiconductor chip 124 and the bottom surface 46. The solder balls 120 connect the active side of the upper semiconductor chip 124 to the inner tracks 16. Similarly, solder balls 122 are provided between the lower semiconductor chip 118 and the top surface 42 for electrically connecting the active side of the lower semiconductor chip 118 to the inner tracks 16.

An underfill material 133 is provided between the bottom surface 46 and the active side of the upper semiconductor chip 124, thereby filling the void between the solder balls 120. Similarly, an underfill material 132 is provided between the active side of the lower semiconductor chip 118 and the top surface 42, thereby filling the void between the solder balls 122.

A second flexible assembly 160 is similar to the first flexible assembly 158. The same reference numerals with a prime symbol are used for similar parts.

The embodiment of FIG. 12 is simple to produce. The electronic device 110 that includes the upper semiconductor chip 124 and the lower semiconductor chip 118 thereby enabling redundancy design in which the upper semiconductor chip 124 can take over the functions of the lower semiconductor chip 118 in the event the lower semiconductor chip 118 malfunctions. Desired functionalities of the electronic device 110 can be attained before the encapsulating process 119', which is at a very late time of assembly.

For interpreting functions of the second embodiment illustrated in FIG. 12, one may also, by way of reference and where appropriate, refer to the explanations and remarks stated above with respect to other embodiments described in relationship to FIGS. 1-9.

The active side of the upper semiconductor chip 124 is connected to an active side of the lower semiconductor chip 118 by electrical paths that are provided by the solder balls 120, the inner tracks 16, and the solder balls 122. The flexible assemblies 158, 160 are of the same type, produced in a single batch, passed through electrical testing, and used for an electronic device.

Figure 13:
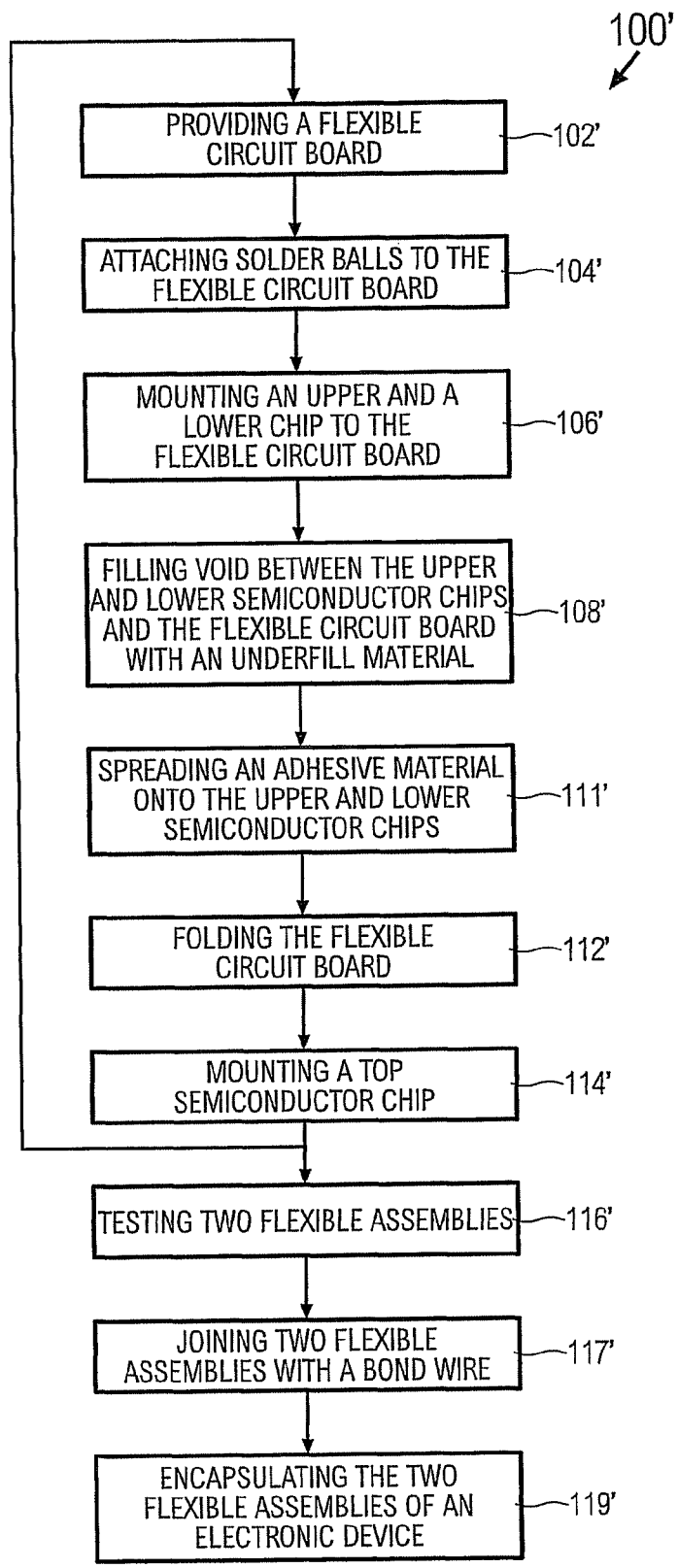
FIG. 13 illustrates a method of making the electronic device of FIG. 12.

FIG. 13 illustrates a method 100' of making the electronic device 110 of FIG. 12. FIG. 13 includes processes that are similar to the processes of FIG. 11. The description of similar processes is incorporated by reference. The same reference numerals with a prime symbol are used for processes that are similar.

The method 100' includes a process 102' in which the solder balls 120, 122 are attached to the inner tracks 16 of the first flexible circuit board 12. In the process 104', the solder balls 64, 81 are also later mounted to the outer tracks 14 of the first flexible circuit board 12 in a predetermined pattern.

The upper semiconductor chip 124 is then mounted onto the solder balls 120, the lower semiconductor chip 118 is mounted onto the solder balls 122, and the top semiconductor chip 63 is attached to the outer tracks 14, in block 106'.

The underfill material 133 is then provided around the periphery of the upper semiconductor chip 124 whilst the underfill material 132 is spread around the periphery of the lower semiconductor chip 118. The underfill material 133 is sucked into and fills the void between the active sides of the upper semiconductor chip 124 and the upper branch 23 by capillary action. Likewise, the underfill material 132 is sucked into and fills the void between the active side of the lower semiconductor chip 118 and the lower branch 25. This is illustrated in block 108'.

In a following process 111', the adhesive material 29 is evenly spread over a surface of the upper semiconductor chip 124 and a surface of the lower semiconductor chip 118.

The first flexible circuit board 12 is folded into a U-profile such that the adhesive materials 29 of both the upper semiconductor chip 124 and the lower semiconductor chip 118 touch each other, in block 112'.

The first flexible assembly 158 and the second flexible assembly 160 are later tested individually, as illustrated in block 116'. In block 118', the first flexible assembly 158 and the second flexible assembly 160 are afterwards laid laterally on a platform. In a following process 117', the bond wire 52 is later bonded onto the first contact pad 26 of the first flexible assembly 158 and onto the second contact pad 28' of the second flexible assembly 60. In a following process 119', the first flexible assembly 158, the bond wire 52, and the second flexible assembly 160 are encapsulated by the mold material 38.

The method 100' allows two semiconductor chips to be provided within the first mother integrated 134, instead of one single semiconductor chip, as in the embodiment illustrated in FIGS. 8-9.

In the above provided descriptions, the same reference numerals with a prime symbol are used for parts with a similar shape or function.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit device comprising:
a first semiconductor chip on a first substrate that includes a first flexible circuit board arranged in a U-shaped folded form having upper and lower branches joined by a bend portion with the first semiconductor chip situated between the upper and lower branches,
a second semiconductor chip on a second substrate that include a second flexible circuit board arranged in a U-shaped folded form having upper and lower branches joined by a bend portion with the second semiconductor chip situated between the upper and lower branches,
wherein a side surface of the first semiconductor chip faces a side surface of the second semiconductor chip, and
an electric cable element connecting the first substrate to the second substrate.

2. The integrated circuit device of claim 1, wherein the electric cable element comprises at least one bond wire.

3. The integrated circuit device of claim 1, wherein the electric cable element comprises at least one bond tape.

4. The integrated circuit device of claim 1, wherein an active side of the first semiconductor chip is facing the first substrate.

5. The integrated circuit device of claim 4, further comprising an array of connecting elements that is provided between the active side of the first semiconductor chip and the first substrate.

6. The integrated circuit device of claim 4, wherein an active side of the second semiconductor chip is facing the second substrate.

7. The integrated circuit device of claim 6, further comprising an array of connecting elements that is provided between the active side of the second semiconductor chip and the second substrate.

8. The integrated circuit device of claim 5, wherein the array of connecting elements comprises solder balls.

9. The integrated circuit device of claim 1, wherein the first substrate is a flexible circuit board.

10. The integrated circuit device of claim 9, wherein the second substrate is a flexible circuit board.

11. The integrated circuit device of claim 1, wherein the first substrate comprises an electrical via that connects a first track on a first surface of the first substrate to a second track on a second surface of the first substrate.

12. The integrated circuit device of claim 11, wherein the second substrate comprises an electrical via that connects a first track on a first surface of the second substrate to a second track on a second surface of the second substrate.

13. The integrated circuit device of claim 1, further comprising a third semiconductor chip mounted onto the first surface of the first substrate such that a passive side of the first semiconductor chip is facing a passive side of the third semiconductor chip.

14. The integrated circuit device of claim 11, further comprising a fourth semiconductor chip mounted onto the second surface of the first substrate.

15. An integrated circuit device comprising:
a first semiconductor chip on a first substrate that includes a first flexible circuit board arranged in a U-shaped folded form having upper and lower branches joined by a bend portion with the first semiconductor chip situated between the upper and lower branches,
a second semiconductor chip on a second substrate that include a second flexible circuit board arranged in a U-shaped folded form having upper and lower branches joined by a bend portion with the second semiconductor chip situated between the upper and lower branches,
an active side of the first semiconductor chip being abreast of an active side of the second semiconductor chip, and
a self-supporting electrical connector extending between the first substrate and the second semiconductor chip.

16. The integrated circuit device of claim 15, wherein the self-supporting electrical connector comprises at least one electric cable element.

17. The integrated circuit device of claim 1, further comprising:
- first conductive tracks situated on a bottom surface of the upper branches, an inner surface of the bend portions and a top surface of the lower branches;
- second conductive tracks situated on a top surface of the upper branches, an outer surface of the bend portions and a bottom surface of the lower branches;
- wherein the first and second conductive tracks each define a predetermined pattern.

18. The integrated circuit device of claim 17, further comprising:
- an electrically insulating layer separating the first and second conductive tracks; and
- a plurality of vias extending through the electrical insulating layer connecting predetermined parts of the first conductive tracks to predetermined parts of the second conductive tracks.

19. The integrated circuit device of claim 17, further comprising:
- a plurality of solder balls electrically connecting respective active sides of the first and second semiconductor chips to the respective inner tracks; and
- underfill material situated between the top surface of the bottom branches and the first and second semiconductors.

* * * * *